United States Patent [19]

Mahoney

[11] Patent Number: 4,805,189
[45] Date of Patent: Feb. 14, 1989

[54] SIGNAL PROCESSING SYSTEM
[75] Inventor: Paul F. Mahoney, Brighton, Mass.
[73] Assignee: Signatron, Inc., Lexington, Mass.
[21] Appl. No.: 829,295
[22] Filed: Feb. 13, 1986
[51] Int. Cl.[4] .......................... H04B 3/46; H04B 17/00
[52] U.S. Cl. ........................................ 375/10; 375/11; 375/96
[58] Field of Search ...................... 375/39, 94, 96, 102, 375/103, 10, 11; 370/97, 104; 455/12, 67; 333/18, 28 R

[56] References Cited

U.S. PATENT DOCUMENTS

| | | | |
|---|---|---|---|
| 3,423,529 | 1/1969 | O'Neill, Jr. | 375/77 |
| 3,769,585 | 10/1973 | Fremouw et al. | 455/67 |
| 3,922,496 | 11/1975 | Gabbard et al. | 370/104 |
| 3,982,075 | 9/1976 | Jefferis et al. | 370/104 |
| 3,993,956 | 11/1976 | Gilmore et al. | 375/96 |
| 4,007,330 | 2/1977 | Winters | 375/84 |
| 4,028,497 | 7/1977 | Saburi | 370/104 |
| 4,117,267 | 9/1978 | Haberle et al. | 370/104 |
| 4,218,654 | 8/1980 | Ogawa et al. | 370/97 |
| 4,355,404 | 10/1982 | Uzunoglu | 375/97 |
| 4,356,456 | 10/1982 | Uzunoglu | 307/48 |
| 4,495,619 | 1/1985 | Acampora | 370/104 |
| 4,633,426 | 12/1986 | Venier | 375/96 |

OTHER PUBLICATIONS

Colby et al. "An Introduction to Testing Techniques in the Intelsat TDMA/DSI Sytem", International Journal of Satellites Communications vol. 2, No. 3, Jul.-Sep. 1984, pp. 145-159.

Mahoney, "The Intelsat TDMA Burst Mode Link Analyser", International Journal of Satellite Communications, vol. 3, Nos. 1 and 2, Jan.-Jun. 1985, pp. 171-177.

Primary Examiner—Robert L. Griffin
Assistant Examiner—Stephen Chin
Attorney, Agent, or Firm—Robert F. O'Connell

[57] ABSTRACT

A signal processing system for measuring the amplitude and time delay responses of a network over the bandwidth allocated to the network wherein a plurality of subburst signals each in the form of a suppressed-carrier, amplitude-modulated signal, is applied to the network. The signals received from the network are provided in complex form having in-phase and quadrature components. Matched filters respond to such components and the matched filter outputs are processed so as to determine the estimated amplitude and time delay responses of the network at the carrier frequency of the subburst signals over the operating bandwidth of the network.

18 Claims, 4 Drawing Sheets

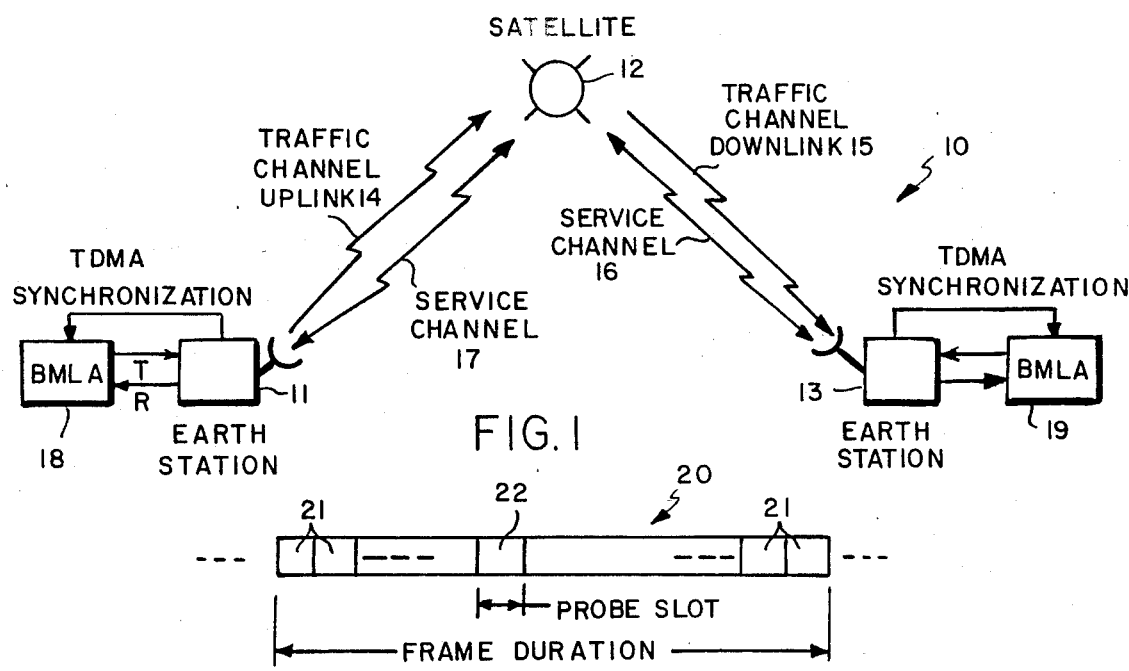
FIG. 1
FIG. 1A
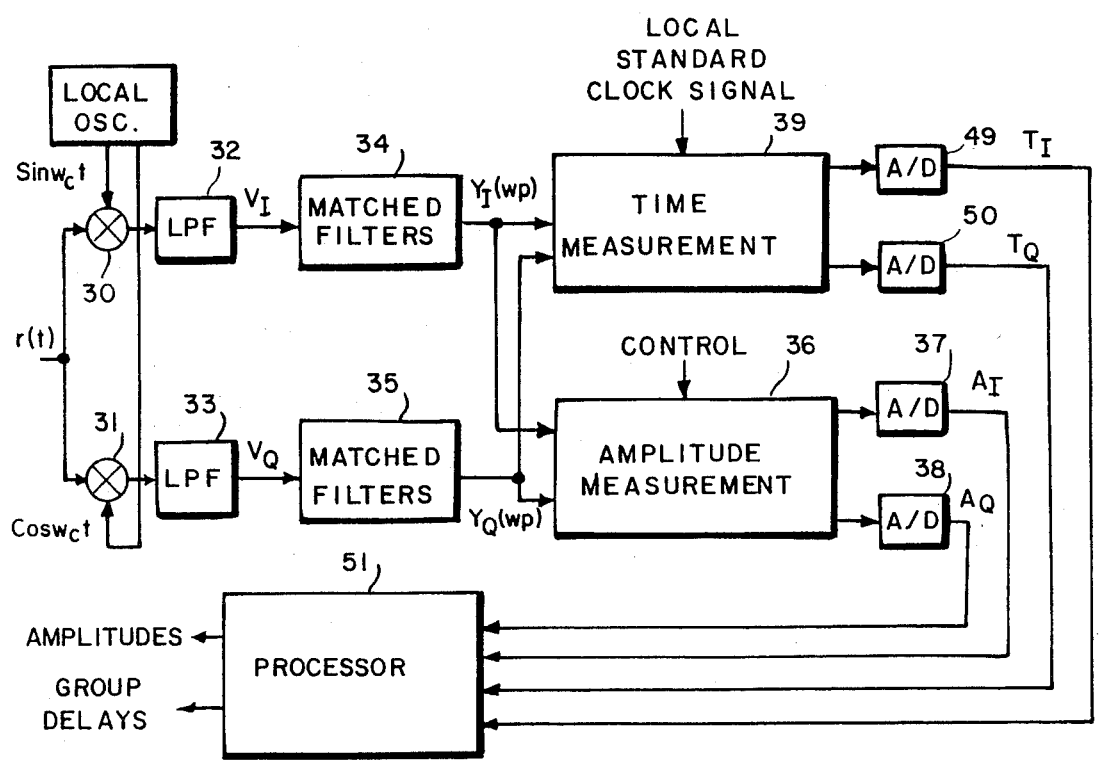
FIG. 3

SIGNAL PROCESSING SYSTEM

This invention relates generally to the processing of signals in a network and, more particularly, to techniques for rapidly and accurately measuring the amplitude and time delay response characteristics of a network over the bandwidth allocated to the network.

BACKGROUND OF THE INVENTION

It is often desirable to provide an accurate estimate of the amplitude and time delay responses of a network. The term network as used herein is intended to be used in a broad sense to include any entity to which input signals can be applied and which operates in some way on such signals to provide output signals therefrom. Thus, such term can be deemed to include circuits for processing, or otherwise handling signals, to include signal links, or signal paths, over or through which signals can be transmitted, and to include as well any combinations of one or more circuits and one or more signal links.

It is helpful to describe the invention by way of a specific example of a network for which the invention finds effective use. An example of one such network is a time division multiple access (TDMA) communications system. The measurement of the time delay and amplitude responses of such a TDMA system often arises, for example, in the context of, although not necessarily limited to, a TDMA satellite communication system. Such a system is normally made up of three major components, namely, a transmitter (sometimes referred to as an an uplink) earth station, a satellite, and a receiving (sometimes known as a downlink) earth station. The TDMA system to be measured is the concatenation of these three major components. Furthermore, the system must be capable of being measured in both directions, since the earth stations normally operate as full-duplex traffic stations, i.e., ones which simultaneously transmit and receive at different frequencies.

The time delay and amplitude characteristics are required to be measured over a specified bandwidth. For example, in TDMA satellites operated by the International Telecommunication Satellite Organization (INTELSAT) and described in the article by R. J. Colby, R. Parthasarathy, and D. W. Prouse, "An Introduction to Testing Techniques in the INTELSAT TDMA/DSI System," *International Journal of Satellite Communications*, Vol. 2, No. 13, July-September 1984, pp. 145-159, such bandwidth is 80 MHz.

The article suggests that a device making such a measurement be referred to as a "burst mode link analyzer" (BMLA), and recommends that it operate using a so-called "radar" approach to the measurement of a TDMA channel. In such radar approach, a signal generator at the transmitter earth station (referred to as the "BMLA" transmitter) generates a short burst of a probe signal in a designated time slot of a frame, as also described in more detail below. The probe signal, as described by Colby et al., comprises a short period pulse signal at the center frequency carrier of the band followed by short periods (bursts) of an offset pulse signal, the frequency of the offset signal being systematically varied in discrete steps from burst to burst or over a plurality of bursts in order to measure the entire TDMA system bandwidth.

In the radar approach, the BMLA compares the time of arrival (TOA) of the band center pulse with the TOA of the pulses at other frequencies, tallies their time differences, and determines the group delay thereof over the system bandwidth. Further, in the radar approach the amplitude is determined by detecting the level of the pulses at each frequency offset and comparing such levels to that of the band center pulse. The processed data are sent by the receiving station to the transmitting station over a service channel which is separate from the traffic channel.

A later article by P. Mahoney, "The INTELSAT TDMA Burst Mode Link Analyzer," *International Journal of Satellite Communications*, Vol. 3, Numbers 1 and 2, January-June 1985, pp. 171-177, describes generally a plan for building a BMLA for INTELSAT and presents a specific technique for implementing such a radar approach to amplitude and time delay measurements. Such paper describes the probe waveform as comprising three subbursts, namely, a reference subburst at the center frequency of the band, followed by two time-sequential subbursts at measurement frequencies symmetrically displaced with respect to the center frequency of the band. The relatively amplitude is measured by comparing the amplitudes of each of the three subbursts, and then dividing these measurements by the amplitude obtained at the center frequency of the band. The delay of each of the three subbursts is measured relative to a local standard. The time of arrival of the burst the burst at the band's center frequency is subtracted from the times of arrival associated with each of the other two subbursts to provide the group delay of the two other subbursts relative to the center frequency subburst.

While such articles generally describe a desirable goal to be obtained, namely, to obtain the amplitude and group time delay measurements as quickly as possible and in a manner which provides a relatively high degree of accuracy in such measurements, neither article discloses any specific system for achieving such goal. The technique of the invention described herein discloses particular approaches to achieving such goal using specific techniques for obtaining relatively fast and accurate measurements of the type desired.

BRIEF SUMMARY OF THE INVENTION

In accordance with the invention wherein estimates of the amplitude and time delay responses of a network are to be determined, a probe signal waveform comprising three time-sequential suppressed carrier subbursts is provided to the network and a specific in-phase and quadrature processing operation is performed on the three signal subbursts received from the network to determine such amplitude and time delay responses. The processing operation uses matched filter techniques to enhance the received signal-to-noise ratio prior to deriving the desired amplitude and group delay estimates. In addition, the invention includes frequency synthesizers which are automatically tuned to the subburst frequencies, circuitry to determine the proper time to sample the subbursts, and a unique means of combining the amplitude and group delay estimates in order to improve the accuracy of such estimates.

DESCRIPTION OF THE INVENTION

The invention can be described in more detail with the help of the accompanying drawings wherein:

FIG. 1 shows a block diagram of a typical TDMA satellite communication system in which the invention can be used;

FIG. 1A shows diagrammatically the relationship between a message frame and a probe slot thereof;

FIG. 3 shows a block diagram of an exemplary embodiment of circuitry for processing a received probe signal waveform in accordance with the invention;

Figure 2:
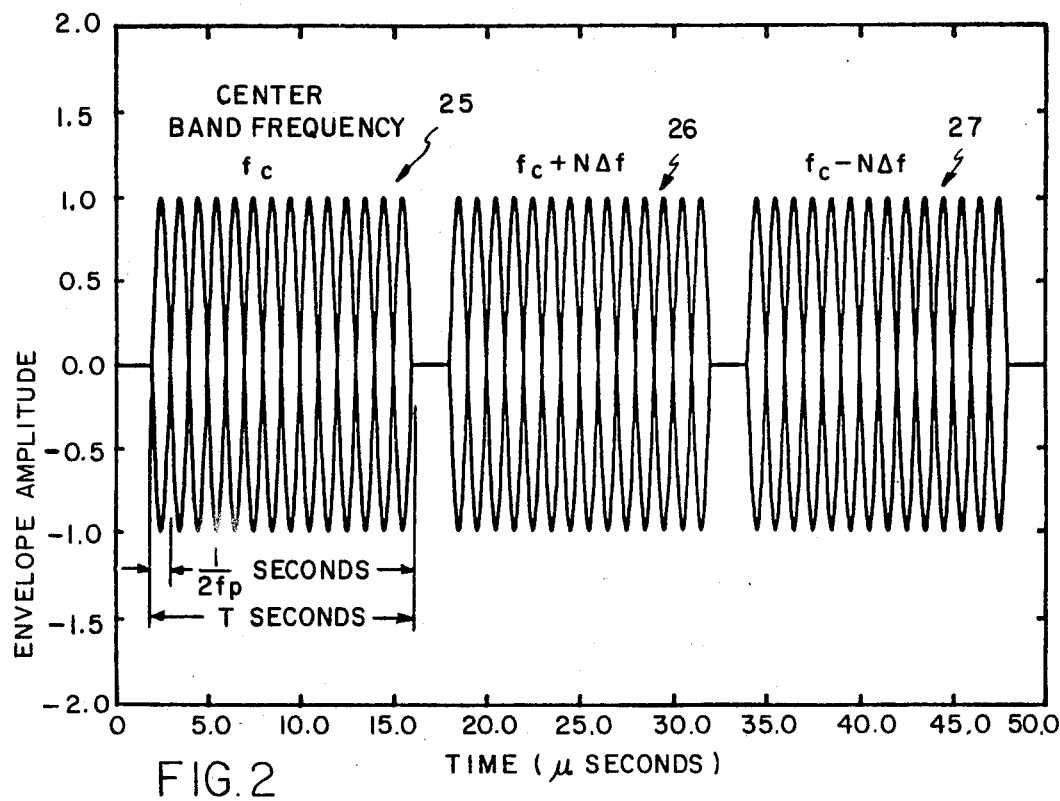
FIG. 2 shows exemplary waveforms of an overall probe signal which includes three signal subbursts as used in a preferred embodiment of the invention.

A specific embodiment of the invention as applied to a network which represents a TDMA communication system can be seen in FIG. 1, wherein a satellite communication system 10 includes a first earth station 11, a satellite 12 and a second earth station 13. Earth station 11, for example, may be a transmitter earth station which supplies communication signals via an uplink traffic channel 14 to satellite 12 which in turn supplies communication signals to earth station 13 (receiving earth station) via a downlink traffic channel 15. A duplex service channel link 16 can be used to supply processed measurement data from earth station 13 through satellite 12 and, thence, to first earth station 11 via a duplex service channel link 17. Such latter channels are also available for supplying other service information between the stations, as desired. A suitable BMLA link analyzer 18 operates in conjunction with earth station 11 and a suitable BMLA link analyzer 19 operates in conjunction with earth station 13. The operation of a BMLA link analyzer useful for such purposes is described in more detail below.

FIG. 1A shows the relationship between the duration of a complete message frame 20 having a plurality of message traffic time slots 21 during which time slots communications traffic (i.e., messages) are transmitted, and one or more specific probe time slots 22 during which specific slots probe signal waveforms are transmitted for measuring amplitudes and time delays in accordance with the invention.

As can be seen in FIG. 2, a typical probe signal waveform for use in the invention comprises a first subburst 25 at a center band frequency $f_c$, followed by two other subbursts 26 and 27 removed from such center frequency by $f_c \pm N\Delta f$, where $f_c$ and $\Delta f$ are expressed in Hertz (Hz) and N is 1, 2, 3, ... etc. In a preferred embodiment each of the three subbursts has a duration of T seconds. Each subburst in a particular probe waveform has the waveform s(t) which can be generally expressed as:

$$s(t) = a \sin(\omega_c t + \phi) \sin(\omega_p t) \quad (1)$$

where $\omega_c$ is the carrier frequency of the subburst in radians per second, which carrier frequency is varied for a plurality of successive probe signals in discrete steps across the overall bandwidth to be measured, $\omega_p$ is the modulation frequency in radians per second, the value of such frequency being substantially less than $\omega_c$, a is the transmitted carrier amplitude in volts, and $\psi$ is a random phase shift in radians.

It will be clear to those in the art that the above expression for s(t) represents a suppressed-carrier, amplitude-modulated waveform. The selection of the carrier frequencies of the three subbursts in the probe signal are such that one is at the center frequency $f_c$ of a selected band, one is at such band center $+N\Delta f$, and one is at such band center $-N\Delta f$. Such selection assures that the overall probe signal waveform is balanced in frequency, as required for many earth stations.

Further, since the subburst is made up of many cycles of the modulation waveform of frequency $\omega_p$, the spectrum of the subburst is substantially contained within the measurement frequency range. This is desirable because it minimizes the possibility of adjacent channel interference, as required for many satellite systems.

A simplified block diagram of the processing to be performed on each of the subbursts of the received probe signal, each subburst being identified as r(t), is shown in FIG. 3. The received signal is of the form:

$$r(t) = A \sin(\omega_c t - \tau_d + \psi) \sin(\omega_p t - \tau_d) + n(t) \quad (2)$$

where A is the received carrier amplitude in volts, $\tau_d$ is the time delay at the subburst center frequency $\omega_c$, and n(t) is a white Gaussian noise component of the received signal.

In accordance with one embodiment of the invention the modulation frequency $\omega_p$ can be selected so that the sidebands are relatively close to the carrier frequency relative to the size of the discrete steps of the subburst on either side of the center frequency in the probe waveforms while still allowing for a relatively reasonable number of cycles in each subburst. The duration T of each subburst is selected to increase the subburst duration for the purpose of improving the measurement signal-to-noise ratio. Tradeoffs between the parameters $\omega_p$ and T, as described by a user, can be made for specific system implementations, as desired.

In a preferred embodiment of the invention a separate local oscillator is used at the transmitter to generate each of the three subbursts at the frequencies desired for each. The local oscillators are each tuned to the desired associated subburst frequencies, while the receiver local oscillators are similarly stepped, thereby removing the frequency $\omega_c$ from further consideration in the signal processing. In a particular implementation of the invention, for example, the local oscillators for the discrete subburst frequencies of the side subbursts (i.e., $f_c \pm \Delta f$) are changed automatically in $\Delta f$ steps after averaging several measurements at one frequency (as discussed below) by automatically tuned frequency synthesizers. Thus, one set of subbursts has frequencies $f_c + \Delta f$, $f_c + 2\Delta f$, $f_c + 3\Delta f$ ... etc., while the other has frequencies $f_c - \Delta f$, $f_c - 2\Delta f$, $f_c - 3\Delta f$ ... etc.

In FIG. 3 a received subburst signal r(t) is demodulated by mixers 30 and 31, using the sine and cosine components respectively, of a local oscillator at the carrier frequency $\omega_c$. Ideally, if the random phase shift angle of the received subburst carrier frequency is known, the receiver local oscillators could be arranged to be in-phase with each of the received subburst signals. Such operation would maximize the in-phase component $V_I$, and minimize the quadrature component, i.e., such component would effectively contain no signal except noise. Since the entire signal would then be effectively contained in $V_I$ there would be no point in processing $V_Q$ and only one receiver channel would be required. In accordance with the system of the invention, however, since the random phase shift of a received subburst signal is not known, a priori, such simpler processing technique cannot be used. However, because the waveform itself is known, except for the random phase shift, nearly equivalent performance can be obtained by processing both the in-phase (I) and the quadrature (Q) components of the received signal and appropriately combining the processed data obtained thereby after suitable matched filtering and suitable time sampling of the received signals, as desired.

In accordance therewith, the I-demodulated and Q-demodulated sine wave $V_I$ and $V_Q$ at frequency $\omega_p$, available from the demodulation process via low pass filters 32 and 33, respectively, are integrated by two bandpass matched filters 34 and 35, tuned to $\omega_p$, respectively. Three separate pairs of matched filters can be used, for example, one associated with each of the subbursts, the filters being appropriately timed (as by being suitably gated between "on" and "off" modes) to be operative with each of the subbursts, as would be well known to those in the art. The impulse response of an ideal matched filter is given by the following expression;

$$h(t) = \begin{cases} \sin \omega_p(T - t) & 0 < t < T \\ 0 & t < 0, t > T \end{cases} \quad (3)$$

where T is the subburst waveform duration. The outputs of each matched filter when excited by the noise-free received subburst is a sinusoid of frequency $\omega_p$ which is amplitude modulated by a linearly increasing ramp for t<T, followed by a sinusoid of frequency $\omega_p$ which is amplitude modulated by a much more slowly linearly descreasing ramp for t>T. The I and Q components of the signal after matched filtering are given by $$Y_1(t) = N_I(t) + \quad (4)$$

$$\left[ \frac{A}{4} \cos \psi \cos [\omega_p (T - t + \tau_d)](t - \tau_d) \quad 0 < t - \tau_d < T \right.$$

$$\left[ \frac{A}{4} \cos \psi \cos [\omega_p (T - t + \tau_d)](2T - t + \tau_d) \quad T < t - \tau_d < 2T \right.$$

$$Y_Q(t) = N_Q(t) + \quad (5)$$

$$\left[ \frac{A}{4} \sin \psi \cos [\omega_p (T - t + \tau_d)](t - \tau_d) \quad 0 < t - \tau_d < T \right.$$

$$\left[ \frac{A}{4} \sin \psi \cos [\omega_p (T - t + \tau_d)](2T - t + \tau_d) \quad T < t - \tau_d < 2T \right.$$

where $N_I(t)$ and $N_Q(t)$ are assumed to be independent white Gaussian noise components.

The peak amplitudes of $y_I$ and $y_Q$ for each of the subbursts are sampled after the end of the interval T by sample-and-hold circuits driving analog to digital (A/D) convertors 37 and 38 to provide digitized peak amplitude values for the I and Q components. The accuracy of this measurement is determined by the signal-to-noise ratio, the timing accuracy, and the quantization noise of the A/D converters used to measure the sampled amplitudes.

The sample timing for all three subbursts is derived from the zero-crossing of the large of $y_I$ or $y_Q$ of the first subburst and can be determined in one embodiment by a technique described with reference to FIG. 4. As seen therein, a particular component 40 (either I or Q) of a received subburst signal 41 has a time duration of T seconds. The peak amplitude 42 of the matched filtered output 43 thereof occurs at the end of the subburst (neglecting the delay of the matched filter itself), i.e., at time T, such time relationship being shown by dashed line 44. The start of a ramp signal 45 then is generated at the first zero-crossing 46 of the matched filter output 43 which follows such peak amplitude. Such point is determined by a suitable zero crossing detector circuit as would be well known to the art. The time relation of such zero-crossing and the start of the ramp signal is shown by dashed line 47. The ramp signal is terminated after two subsequent zero-crossings of a local standard clock signal having the same slope, e.e., in the example shown, at zero-crossing 48 which is the second subsequent zero-crossing having the same positive slope of such local standard, having a frequency of $\omega_p$, for example. The amplitude A of the ramp signal 45 then represents the desired time measurement. Implementation of the technique described in FIG. 4 would be well within the skull of those in the art using appropriate circuitry for determining the zero-crossing involved and for generating the ramp signal and using a local standard clock signal to determine the ramp signal amplitude at the time of the zero-crossing 48 thereof. Such time measurements for either the in-phase and quadrature components of a particular subburst are so determined and converted to digitized form using either A/D circuit 49 or 50, as shown in FIG. 3, to provide the time measurements $T_I$ or $T_Q$, respectively, for each subburst component involved, which measurement, together with the corresponding peak amplitude measurements, for each component, $A_I$ and $A_Q$, are supplied to processor 51 as discussed below.

Figure 4:
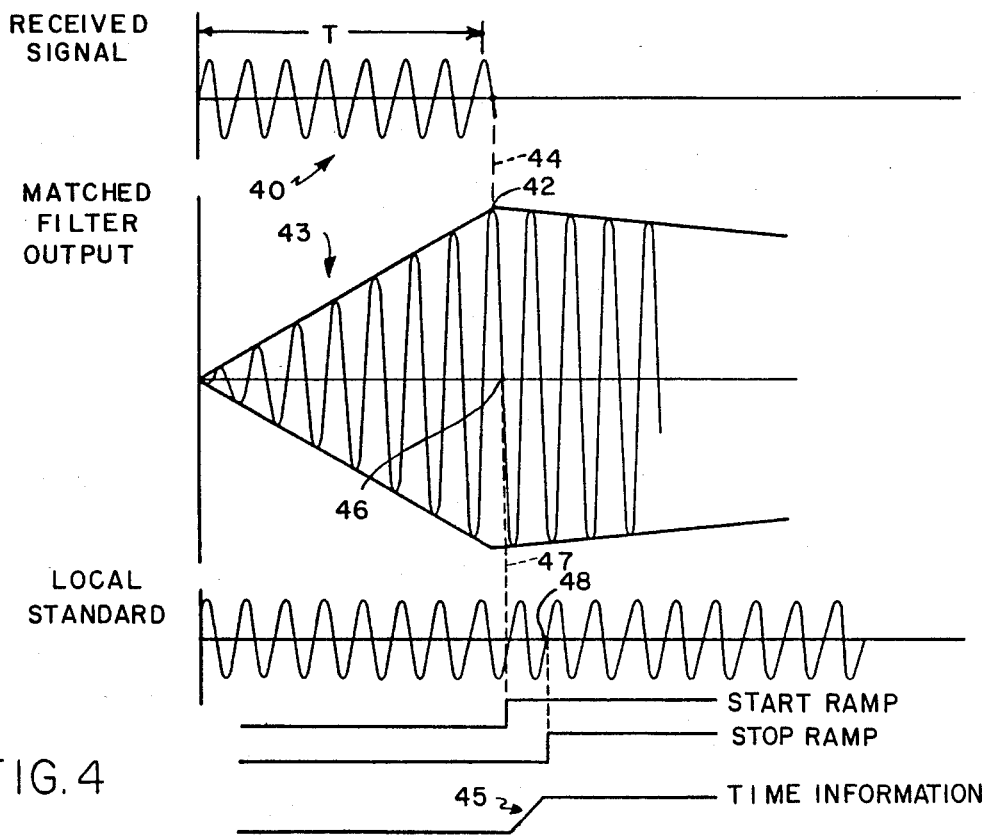
FIG. 4 shows diagrammatically the time measurement technique used to determine the desired time delay information for the circuitry of FIG. 3.

While the local standard clock signal in FIG. 4 is depicted as having a frequency which is essentially the same as that of the subburst modulation frequency, $\omega_p$, greater accuracy can be obtained using a local standard clock signal frequency much higher than the modulation frequency. A more detailed explanation thereof can be seen in FIG. 5.

As can be seen therein, determination of ramp signal amplitudes for each of the three subbursts are depicted with reference to the center frequency subburst 25 at $f_c$, used as a reference subburst, and at the $f_c \pm \Delta f$ subbursts 26 and 27, respectively. Although for convenience the drawing illustrates the three subbursts in the manner depicted, it should be understood that the processing of each subburst occurs in sequence, the reference subburst zero crossing and sample ramp signals being processed over a first time frame, those of the $f_c + N\Delta f$ subburst being processed over a subsequent time sequential time frame and those of the $f_c - N\Delta f$ subburst being processed over a subsequent time sequential time frame. In connection with the reference subburst a zero-crossing detector is enabled at a suitable time prior to generating the ramp, i.e., after the peak, as shown by the ENABLE signal waveform 55. A local standard clock signal 56 is provided by a suitable clock generator at a clock frequency much higher than that of the subburst modulation frequency $\omega_p$, e.g. at a frequency of 10 MHz when using a $\omega_p$ of 0.5 MHz.

After the first zero-crossing 57 of the reference subburst signal 25 (only a portion of which is shown near such zero-crossing), which zero-crossing can be in a positive or a negative going direction as shown, a ramp signal is generated, following a short delay, and a counter clocks off a selected fixed number of 10 MHz clock signal time periods, beginning at the first full clock period 59 following the zero-crossing up to the end of the last such clock period 60 of interest (e.g. for a 10 MHz clock at the end of the fifth clock period, 500 nsec. later) when using, for example, a modulation frequency of 0.5 MHz. To simplify the processing the frequency of the local clock should be chosen so that an integral number of clock cycles occurs between subbursts. At the time 60 the amplitude of the ramp signal is sampled and held at its value by suitable sample and hold circuitry which thereby provides a value representing a reference subburst time measurement.

At the fixed time (i.e., a fixed number of local clock periods thereafter), a time which depends on the known separation between each subburst, on possible expected variations in the zero-crossing times, and on the maximum group delay to be measured, zero detection circuitry for use with the next subburst signal (e.g. the $f_c + \Delta f$ subburst 26) is enabled and the ramp signal amplitude therefor is sampled and held at a known fixed time period following the measurement of the reference ramp signal amplitude. Thus, for a modulation frequency of 0.5 MHz, a known subburst time duration of 14 microseconds ($\mu$sec.), a known time separation between subbursts of 16 $\mu$sec., and a range of time delay measurements of ±0.2 usec., zero detection circuitry for the $f_c + \Delta f$ subburst is enabled 15.6 $\mu$sec. (allowing a 0.2 $\mu$sec. guard range) after the amplitude sample of the reference ramp signal and the sampling of the $f_c + \Delta f$ ramp signal is taken at 16.0 $\mu$sec. after the reference sampling.

In a similar manner, zero detection circuitry associated with the $f_c - \Delta f$ subburst signal is enabled at a selected fixed time after the reference ramp amplitude is determined (e.g. 31.6 $\mu$sec. thereafter and the amplitude of the ramp signal associated with the $f_c - \Delta f$ subburst is sampled at a fixed time period after the reference ramp sampling (e.g. 32.0 $\mu$sec. thereafter).

The use of such a higher frequency clock standard permits a greater accuracy to be achieved than would be possible using a local clock signal at the same frequency as the subburst modulation frequency since much of the ramp would represent time of little interest.

The A/D converters 37, 38, 49 and 50 have N bits. The nominal signal level in a specific embodiment of the invention is typically set at half of the peak level to accommodate a 6 dB larger than normal signal. Therefore, the quantization level is $2^{-N+1}$ of the nominal level. The peak variation in the measured amplitude due to quantization is 20 log $(1+2^{-N+1})$ dB. For typical values of N, this insignificant, e.g., for N=10, the quantization error is as low as 0.2 dB.

The use of the matched filters 34 and 35 significantly improves the measurement accuracy over that of previously proposed systems, as can be seen by the following discussion. If the carrier-to-noise ratio CNR in a bandwidth B for a CW carrier is denoted by CNR dB, the amplitude modulated signal with a peak value equal to the CW level has 3 dB less average power. Therefore, for an input signal-to-noise ratio input SNR, the bandwidth B is CNR $-3$ dB. The matched filter has a bandwidth of 1/T. Thus, the SNR is improved by a factor of BT, which is much greater than unity. Typically, a 30 dB improvement can be achieved, i.e., the BT product can be at approximately 1000. The two samples of $y_I$ and $y_Q$ at each peak amplitudes of the I and Q matched filter outputs are denoted by $A_I$ and $A_Q$. The estimate of the peak signal amplitude, $A_{I+Q}$, is computed by combining the samples as follows:

$$A_{I+Q}^2 = A_I^2 + A_Q^2 \tag{6}$$

Using the previous equations $A_{I+Q}^2$ can be expressed as:

$$\begin{aligned} A_{I+Q}^2 &= \left(\frac{A}{4}\cos\psi + n_I\right)^2 + \left(\frac{A}{4}\sin\psi + n_Q\right)^2 \\ &= \frac{A^2}{16}\cos^2\psi + \frac{A}{2}\cos\psi\, n_I + n_I^2 + \\ &\quad \frac{A^2}{16}\sin^2\psi + \frac{A}{2}\sin\psi\, n_Q + n_Q^2 \end{aligned} \tag{7}$$

The expected value $E\{A^2_{I+Q}\}$ is:

$$E\{A_{I+Q}^2\} = \frac{A^2}{16} + \sigma_{n_I}^2 + \sigma_{n_Q}^2 \tag{8}$$

where $\sigma_{n_I}^2$ and $\sigma_{n_Q}^2$ are the variances of the sampled noise processes and are assumed to be equal. For a BT of 30 dB, the error in the expected value of $A^2_{I+Q}$ is typically less than 0.01 db, which is insignificant.

The standard deviation s of the amplitude measurement is:

$$s = 10 \log\left(1 \pm 2\sqrt{\frac{1}{SNR}} + \frac{1}{SNR}\right), \tag{9}$$

which is typically in the order of 0.25 dB. When seven samples are averaged, the resulting estimate has a standard deviation of 0.1 dB and, if a larger number than seven samples is averaged, the standard deviation becomes accordingly smaller.

The time measurements are made of both the in-phase and quadrature signals at the output of the matched filters, as discussed with reference to FIG. 4. The time measurements of the reference subburst is subtracted from the time measurements of each of the offset frequency bursts in processor 51. This process subtracts out the delay of the standard to provide the desired relative group delay.

The time measurement $T_I$ made in the in-phase channel is combined with the time measurement $T_Q$ of the quadrature channel using the measured values of $A_I$ and $A_Q$ to weight the measurement in proportion to their respective SNRs, as follows:

$$T_{I+Q} = \frac{A_I^2 T_I + A_Q^2 T_Q}{A_I^2 + A_Q^2}. \tag{10}$$

Since $A_I$ and $A_Q$ are accurate measurements of peak amplitudes of the in-phase and quadrature components, we have $$A_I = \frac{A}{4} \cos \psi \quad (11)$$

$$A_Q = \frac{A}{4} \sin \psi \quad (12)$$

The values of $A_{I+Q}$ and $T_{I+Q}$ are obtained by a processor 51 using Eq. (5) and Eq. (10) and the implementation of a processor circuit for such purpose should be well within the skill of the art. Therefore, $$T_{I+Q} = \cos^2 \psi T_I + \sin^2 \psi T_Q \quad (13)$$

The time measurements are the sum of a noiseless term and a noise term as follows:

$$T_I = T_0 + n_{tI} \quad (14)$$

and $$T_Q = T_0 + n_{tQ} \quad (15)$$

where $T_0$ is the desired time value and $n_{tI}$ is a zero mean Gaussian random variable expressed as follows:

$$n_{tI} = \frac{n_I}{\text{slope}} = \frac{n_I}{k \cos \psi} \quad (16)$$

where $k \cos \psi$ is the slope of the desired in-phase component at the zero-crossing.
Similarly, $$n_{tQ} = \frac{n_I}{k \sin \psi} \quad (17)$$

Accordingly, $$T_{I+Q} = \cos^2 \psi \left[ T_0 + \frac{n_I}{k \cos \psi} \right] + \sin^2 \psi \left[ T_0 + \frac{n_Q}{k \sin \psi} \right] \quad (18)$$

which can be expressed alternatively as $$T_{I+Q} = T_0 + \frac{n_I \cos \psi + n_Q \sin \psi}{k} \quad (19)$$

Since $T_I = T_Q$, the expression $VAR(T_{I+Q})$ can be expressed as:

$$VAR(T_{I+Q}) = \frac{\sigma_I^2 \cos^2 \psi + \sigma_Q^2 \sin^2 \psi}{k^2} = \frac{\sigma_I^2}{k^2} \quad (20)$$

If the local oscillator were exactly in-phase with the signal, the quadrature term would be zero and the variance of the time measurement would be:

$$\sigma_T^2 = \frac{\sigma_I^2}{k^2} \quad (21)$$

which is the same result that is obtained for all phases when the above described combining technique is used. It should be noted that a coherent receiver can be used to detect the signal. However, such a receiver requires the use of relatively expensive circuitry to make the local oscillator in-phase with the signal. The use of the above technique of the invention achieves performance which is equivalent to that of a coherent receiver at less expense.

For typical system parameters, $\sigma_T$ is approximately five nanoseconds, which is the standard deviation of a single measurement. Two time measurements must be subtracted to obtain the desired time difference. The standard deviation of the difference is than $\sqrt{2}\sigma_T$. To reduce the standard deviation to less than one nanosecond, as is typically required, approximately fifty samples must be averaged. In a specific embodiment the amplitude measurement typically would require the averaging of fewer samples, so that the group delay measurement determines the overall measurement time.

While the technique discussed above with reference to FIGS. 4 and 5 for measuring $T_I$ and $T_Q$, as well as $A_I$ and $A_Q$, is useful in many applications, in other applications even greater accuracy may be desired than can be achieved by such technique. It has been found that starting the ramp generator with a zero-crossing detector has some limitations inherent in the state of the art due to noise, and comparable errors due to offsets and so forth. An alternative approach for making such time measurements is discussed below with reference to FIGS. 6 and 7. The main improvement this method affords is referencing all measurements to a local standard, thus eliminating the randomness associated with the zero-crossing detector.

Figure 6:
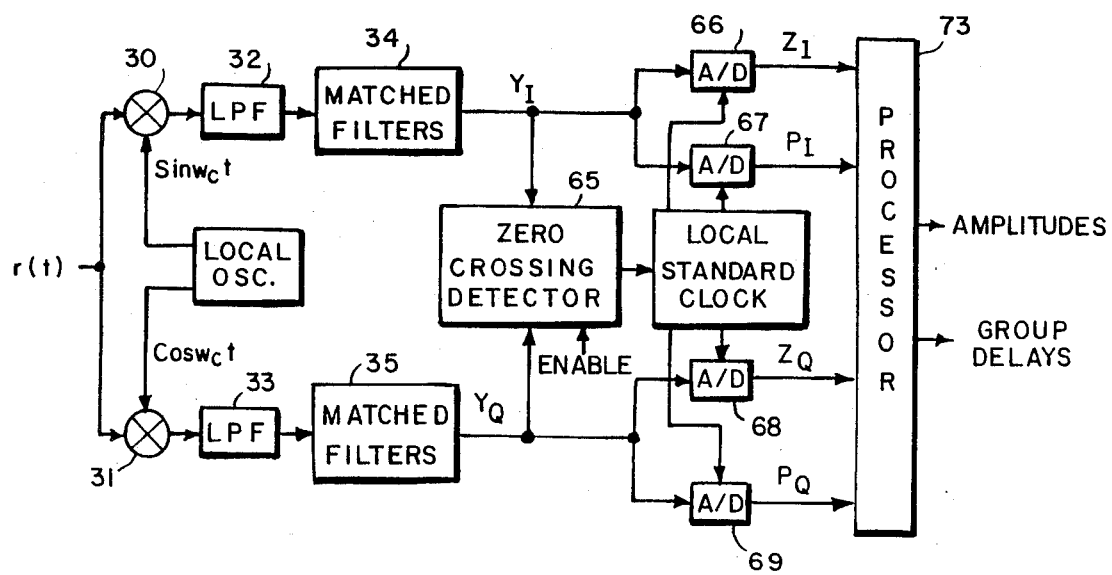
FIG. 6 shows a block diagram of an alternative embodiment of circuitry for processing a received probe signal waveform in accordance with the invention.

As can be seen with reference to FIG. 6, the system depicted is similar to that shown in FIG. 3 up to the I and Q outputs of the matched filters 34 and 35. The matched filter output of a subburst component is supplied to a zero-crossing detector circuit 65 which is appropriately enabled, as before, and detects the first zero-crossing thereafter. Such operation can be understood with reference to FIG. 7 in which the modulation signal 70 of a subburst component (e.g., the reference subburst $f_c$) has a first zero-crossing 71 after enablement. A suitable counter circuit counts a selected number of pulses of a local standard pulse signal 72 (e.g., 10 MHz) beginning with the first pulse 72A after zero-crossing 71. Since the modulation frequency is known, the number of pulses is selected at a first count so as to end at a point near the peak 73 of the signal 70, e.g., the first pulse count ends at pulse 72B in the example drawn. The amplitude P of the subburst is then measured at such count, which for an exemplary in-phase signal can be designated as $P_I$ as shown in the figure.

Figure 7:
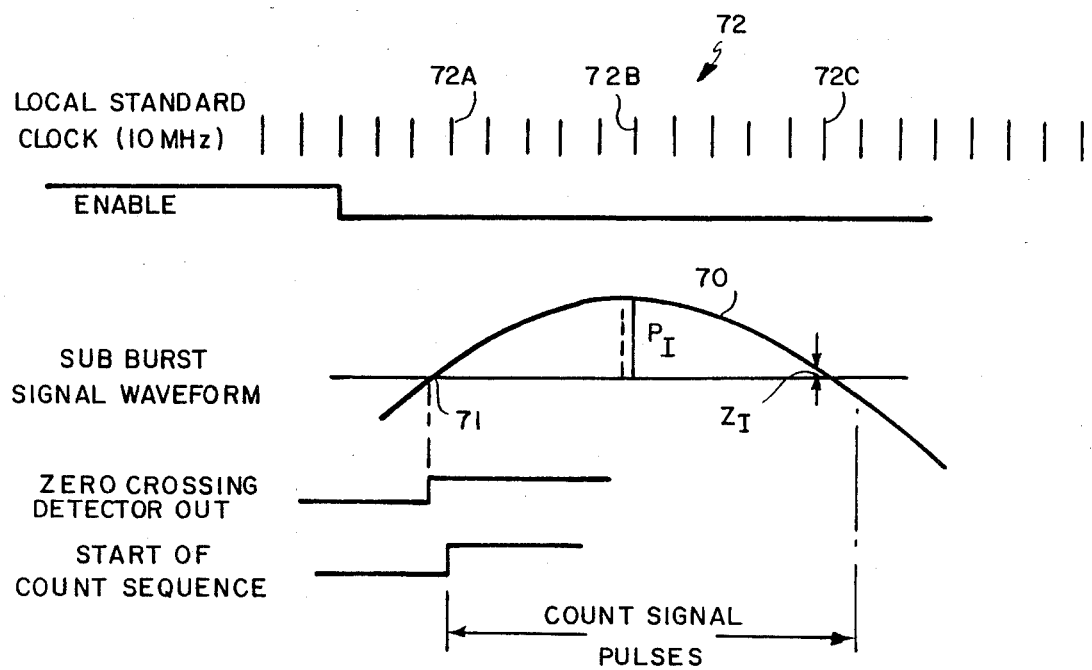
FIG. 7 shows a drawing of a portion of a sample subburst waveform of a probe signal subburst which drawing is helpful in understanding the operation of the circuitry of FIG. 6.

The pulse counter then counts a number of pulses which represent $\pi/2$ of the waveform to pulse 72C and measures the amplitude $Z_I$ at that point as depicted in FIG. 7. The values of $P_I$ and $Z_I$ are converted to digital form by A/D converters 66 and 67. In a similar manner the values of $P_Q$ and $Z_Q$ of the quadrature component can also be measured and converted to digital form at A/D converters 68 and 69. The following relations hold for the in-phase and the comparable quadrature component signal waveforms of the subburst:

$$\tan \phi_Q = \frac{Z_I}{P_I} \quad (22)$$

and $$\tan \phi_Q = \frac{Z_Q}{P_Q} \quad (23)$$

The time delays $T_I$ and $T_Q$ for such in-phase and quadrature components are then:

$$T_I = \frac{1}{2\pi f_p} \phi_I = \frac{1}{2\pi f_p} \tan^{-1} \frac{Z_I}{P_I} \quad (24)$$

$$T_Q = \frac{1}{2\pi f_p} \phi_Q = \frac{1}{2\pi f_p} \tan^{-1} \frac{Z_Q}{P_Q} \quad (25)$$

The peak amplitudes are represented as follows:

$$A_I = \frac{P_I}{\tan \phi_I + 90°} \quad (26)$$

$$A_Q = \frac{P_Q}{\tan \phi_Q + 90°} \quad (27)$$

Once the above values are determined the combined time delays $T_{I+Q}$ and $A_{I+Q}$ can be represented as follows as has already been discussed with reference to the technique described in connection with FIGS. 3–5:

$$T_{I+Q} = \frac{A_I^2 T_I + A_Q^2 T_Q}{A_I^2 + A_Q^2} \quad (28)$$

$$A_{I+Q}^2 = A_I^2 + A_Q^2 \quad (29)$$

Such equations correspond to those mentioned above as Eqs. (6) and (10).

The above calculations can be made in a suitable processor 73 for each of the subburst waveforms as discussed above for processor 51 of FIG. 3. Using the subburst at $f_c$ as the reference waveform, the group time delay values and amplitude values for each of the side subbursts (at $f_c \pm \Delta f$) can be determined and averaged over many samples (e.g., over M samples) obtained using either of the techniques described above and compared to the time and amplitude values of the reference $f_c$ waveforms to provide the desired averaged group time delay and peak amplitude values $T_m$ and $A_m$ as follows:

$$T_M = \frac{1}{M} \sum_{M=0}^{M} (T_{I+Q,M} - T_{R,M}) \quad (30)$$

where: $T_{I+Q,M}$ are M samples of a side subburst time delay and $T_{R,M}$ are M samples of the reference subburst; and $$A_M = \frac{1}{M} \sum_{M=0}^{M} \sqrt{\frac{A_{I,M}^2 + A_{Q,M}^2}{A_{R,I,M}^2 + A_{R,Q,M}^2}} \quad (31)$$

where: $A_{I,M}$ and $A_{Q,M}$ are the in-phase and quadrature amplitude values of M samples of a side subburst and $A_{R,I,M}$ and $A_{R,Q,M}$ are the in-phase and quadrature amplitude values of M samples of the reference subburst. Such computations are also made in accordance with the above equations in processor 51 or processor 73 depending on which technique is used. The programming of a suitable processor for implementing the above equations would be well within the skill of the art. Accordingly, the processors 51 and 73 each can provide the desired averaged values $A_M$ and $T_M$ for each of the side subbursts at the frequencies $f_c \pm \Delta f$.

Figure 5:
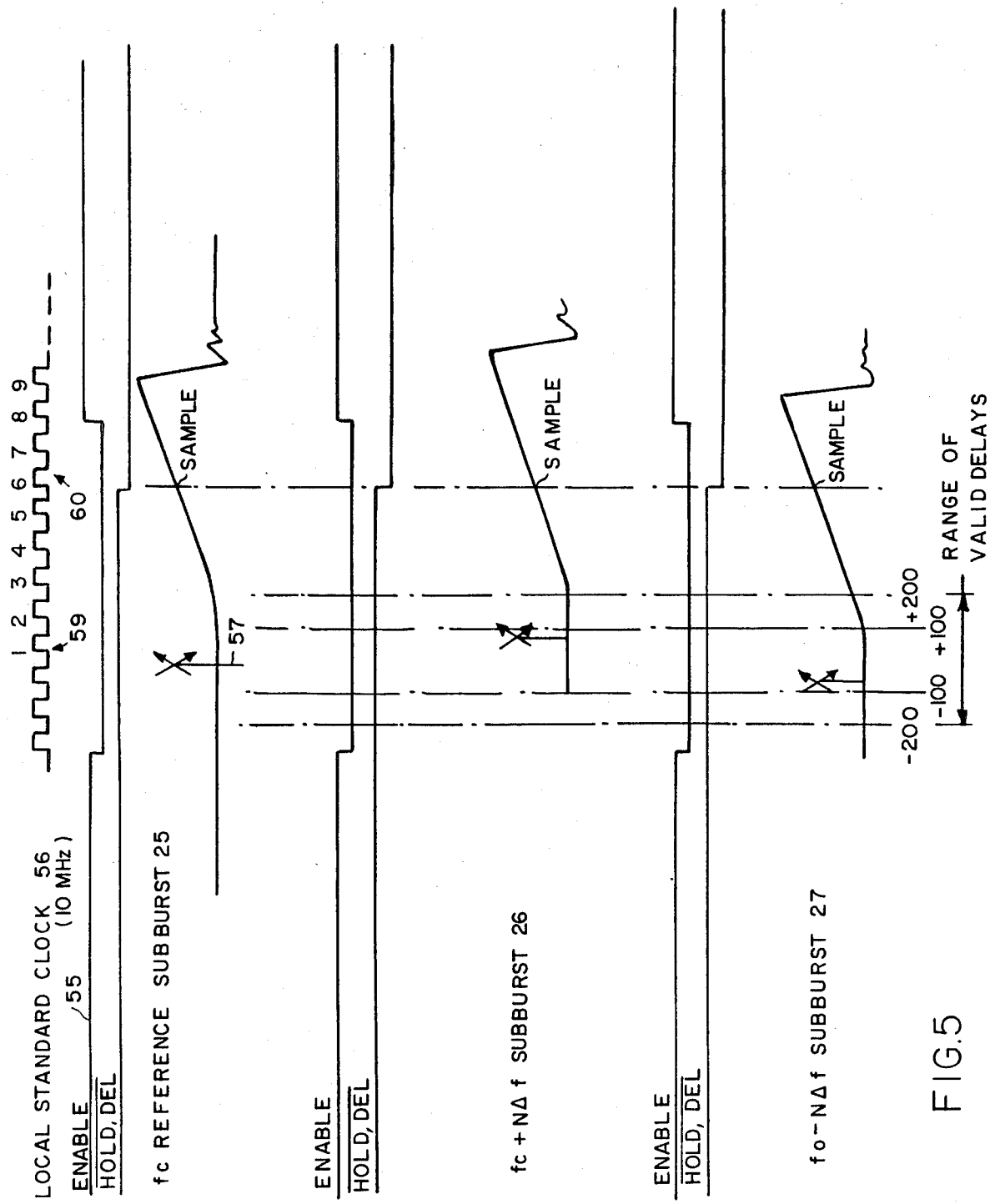
FIG. 5 shows a more detailed drawing of the time relationship of ramp signals generated for the three sample subbursts of the probe signal waveform as discussed with reference to FIG. 4.

The overall process, whether using the technique of FIGS. 4 and 5 or that of FIGS. 6 and 7, is performed in the same manner for side subbursts at $f_c \pm 2\Delta f$, $f_c \pm 3\Delta f$, ... etc., until frequencies over the entire band of interest have been covered so as to provide the averaged $A_M$ and $T_M$ values across the complete band. The value $\Delta f$ is selected to provide the desired resolution over such band.

While the specific embodiments of the invention described above relate to a TDMA communications satellite system, it will be realized by those in the art that the techniques thereof can be used for any network, as discussed and broadly defined above, so that the invention is not to be construed as limited to any specific embodiment, except as defined by the appended claim.

What is claimed is:

1. A signal processing system for use with a network to measure the amplitude response and the time delay response of the network over its operating bandwidth, said system comprising means for providing a plurality of subburst signals to said network, each in the form of a suppressed-carrier, amplitude-modulated signal having an in-phase component only, the carrier frequencies of said subburst signals being within the operating bandwidth of said network and one of said subburst signals capable of being used as a reference subburst signal;

means for receiving from said network said subburst signals, said receiving means including means responsive to each of said received subburst signals for providing complex received subburst signals at the modulation frequency of said suppressed carrier signals each having in-phase and quadrature components thereof;

filter means responsive to the in-phase and quadrature components of said signals for providing in-phase and quadrature filter outputs thereof; and processing means responsive to said filter outputs for determining the estimated amplitude and time delay responses of said system at the carrier frequencies of said subburst signals over the operating bandwidth of said network.

2. A signal processing system in accordance with claim 1 wherein said plurality of subburst signals are transmitted in a plurality of groups of three subburst signals, a first subburst signal of each group having a carrier frequency at the center frequency of said operating bandwidth, a second subburst signal of each group having a carrier frequency which is above that of said center frequency and a third subburst signal of each group having a carrier frequency which is below that of said center frequency, the first, second and third subburst signals in each group being transmitted in serial time sequence relative to each other.

3. A signal processing system in accordance with claim 2 wherein the carrier frequencies of said second and third subburst signals in each group differ from said center frequency by the same amount.

4. A signal processing system in accordance with claim 3 wherein said first subburst signal of each group is used as said reference signal and the estimated amplitude and time delay response of each of said second and third subburst signals in each group are determined by said processing means relative to the estimated amplitude and time delay responses of the first subburst signal in said group.

5. A signal processing system in accordance with claim 4 wherein different groups of three subburst signals are transmitted successively, each group being transmitted a selected number of times before a successive group is transmitted, and the carrier frequency differences of the second and third subburst signals with reference to said center frequency in each successive group are increased by selected amounts in each successive group.

6. A signal processing system in accordance with claim 5 wherein the carrier frequencies of the second and third subburst signals differ from the reference center frequency in each successive group by $\pm\Delta f$, $\pm 2\Delta f, \ldots \pm N\Delta f$, where N is selected so that $f_c \pm N\Delta f$ represent frequencies at or near the highest and lowest frequencies of interest in said operating bandwidth.

7. A signal processing system in accordance with claim 1 wherein said processing system includes
means for providing a fixed frequency clock signal;
means responsive to said in-phase and quadrature filter outputs of a subburst signal signal for measuring the peak amplitude value for said signal and for measuring the estimated time delay value between the occurrence of said peak amplitude value and at least one selected zero-crossing of said fixed frequency clock signal; and
means responsive to the peak amplitude values and the time delay values of the in-phase and quadrature components of each of said subburst signals for processing said peak amplitude and time delay values so as to determine the amplitude and time delay values of said subburst signal relative to the amplitude and time delay times of said reference subburst signal.

8. A signal processing system in accordance with claim 7 wherein said fixed frequency clock signal has a frequency which is equal to the modulation frequency of said suppressed-carrier, amplitude-modulated subburst signals.

9. A signal processing system in accordance with claim 7 wherein said fixed frequency clock signal has a frequency which is greater than the modulation frequency of said suppressed carrier, amplitude-modulated subburst signals.

10. A signal processing system in accordance with claim 7 wherein said processing means includes a zero-crossing detection means for determining the time delay values for the in-phase and quadrature components of each subburst signal by measuring the time difference between the time of the first zero-crossing of each of the filter outputs for the subburst signal which follows the peak amplitude value of said component and the time of the last zero-crossing of a selected number of zero-crossings having the same slope as said clock signal.

11. A signal processing system in accordance with claim 10 wherein said selected number of zero-crossings is two when said clock signal has a frequency equal to the modulation frequency of said subburst signals.

12. A signal processing system in accordance with claim 10 wherein said selected number of zero-crossings is greater than two when said clock signal has a frequency greater than the modulation frequency of said subburst signals.

13. A signal processing system in accordance with claim 10 wherein said time difference is measured by generating a ramp signal which begins at said first zero-crossing, the amplitude of said ramp signal at said last zero-crossing representing said time difference.

14. A signal processing system in accordance with claim 7 wherein the estimated time delay response of each subburst signal other than that of said reference subburst signal is determined by comparing the time difference measured for said subburst signal with the time difference measured for said reference subburst signal.

15. A signal processing system in accordance with claim 1 wherein said processing means includes
means for providing a fixed frequency clock signal;
means responsive to said in-phase and quadrature filter components for detecting the time of the first zero-crossing following the peak amplitude of said component, for determining a first amplitude of said component at a selected time after said first zero-crossing, and for determining a second amplitude of said component at a second selected time after said first zero-crossing;
said processing means being further responsive to said first and second amplitudes of a plurality of in-phase and quadrature components of a subburst signal for providing amplitude and time delay values of said subburst signal for determining the estimated amplitude and time delay responses of said subburst component relative to a reference subburst signal.

16. A signal processing system in accordance with claim 1 wherein said network is a time division multiple access communication system.

17. A signal processing system in accordance with claim 6 wherein said filter means are matched filter means.

18. A signal processing system in accordance with claim 1, wherein said processing means for providing said estimated time delay response $T_{I+Q}$ of a subburst signal includes means for determining $T_{I+Q}$ is accordance with the following equation:

$$T_{I+Q} = \frac{A_I^2 T_I + A_Q^2 T_Q}{A_I^2 + A_Q^2}$$

wherein $T_I$ is the time delay measurement of the in-phase component of a subburst signal, $T_Q$ is the time delay measurement of the quadrature component of a subburst signal, $A_I$ is the peak amplitude of the in-phase component of a subburst signal, and $A_Q$ is the peak amplitude of the quadrature component of a subburst signal.

* * * * *